United States Patent
Ebe et al.

(10) Patent No.: US 8,917,022 B2
(45) Date of Patent: Dec. 23, 2014

(54) PLASMA GENERATION DEVICE AND PLASMA PROCESSING DEVICE

(75) Inventors: Akinori Ebe, Kyoto (JP); Yasunori Ando, Otsu (JP); Masanori Watanabe, Katano (JP)

(73) Assignees: EMD Corporation, Yasu-Shi (JP); Yasunori Ando, Otso-Shi (JP)

( * ) Notice: Subject to any disclaimer, the term of this patent is extended or adjusted under 35 U.S.C. 154(b) by 257 days.

(21) Appl. No.: 12/993,640

(22) PCT Filed: May 21, 2009

(86) PCT No.: PCT/JP2009/002234
§ 371 (c)(1),
(2), (4) Date: Jan. 27, 2011

(87) PCT Pub. No.: WO2009/142016
PCT Pub. Date: Nov. 26, 2009

(65) Prior Publication Data
US 2011/0115380 A1    May 19, 2011

(30) Foreign Application Priority Data

May 22, 2008  (JP) ................. 2008-133881

(51) Int. Cl.
*H01J 7/24*       (2006.01)
*H05H 1/46*       (2006.01)
*H01J 37/32*      (2006.01)

(52) U.S. Cl.
CPC ............ *H05H 1/46* (2013.01); *H01J 37/32091* (2013.01); *H01J 37/321* (2013.01); *H01J 37/32183* (2013.01); *H01J 37/3266* (2013.01); *H01J 37/3211* (2013.01); *H01J 37/32174* (2013.01)
USPC ............. 315/111.51; 315/111.21; 315/111.71

(58) Field of Classification Search
CPC ............... H01J 37/321; H01J 37/3211; H05B 37/32082
USPC .................... 315/51, 111.21, 111.41–111.81; 118/50, 50.1, 621, 623, 723 R, 723 AN, 118/723 I, 723 IR, 733; 156/345.44, 345.45, 156/345.48; 343/701, 845, 847, 851–853, 343/860
See application file for complete search history.

(56) References Cited

U.S. PATENT DOCUMENTS 5,573,595 A    11/1996  Dible
5,846,883 A *  12/1998  Moslehi ................. 438/711
(Continued)

FOREIGN PATENT DOCUMENTS

DE    696 30 589 T2    9/2004
EP    0 929 093 A      7/1999
(Continued)

OTHER PUBLICATIONS

Aug. 16, 2012 Office Action issued in Chinese Application No. 200980117009.8 (with translation).

(Continued)

*Primary Examiner* — Haiss Philogene
(74) *Attorney, Agent, or Firm* — Oliff PLC

(57) ABSTRACT

A flange, which forms a portion of a vacuum container, has a rectangular opening surrounded by an insulating frame. A plate-shaped radio-frequency antenna conductor 13 is provided so as to cover the opening, with the insulating frame clamped thereby. In this structure, a radio-frequency power source is connected via a matching box to one end along the length of the radio-frequency antenna conductor, the other end is connected to ground, and electric power is supplied so that a radio-frequency current flows from one end of the radio-frequency antenna conductor to the other. By this method, the impedance of the radio-frequency antenna conductor can be lowered, and high-density plasma with a low electron temperature can be efficiently generated.

45 Claims, 13 Drawing Sheets

(56) References Cited

U.S. PATENT DOCUMENTS

| | | | |
|---|---|---|---|
| 6,043,608 A * | 3/2000 | Samukawa et al. | 315/111.51 |
| 6,152,071 A | 11/2000 | Akiyama et al. | |
| 6,155,199 A * | 12/2000 | Chen et al. | 118/723 I |
| 6,164,241 A * | 12/2000 | Chen et al. | 118/723 I |
| 6,244,211 B1 * | 6/2001 | Nishikawa et al. | 118/723 AN |
| 6,245,202 B1 * | 6/2001 | Edamura et al. | 204/298.06 |
| 7,098,599 B2 * | 8/2006 | Miyake et al. | 315/111.21 |
| 7,442,273 B2 | 10/2008 | Kwon et al. | |
| 7,567,037 B2 * | 7/2009 | Setsuhara et al. | 315/111.21 |
| 7,605,008 B2 * | 10/2009 | Chua et al. | 438/7 |
| 7,845,310 B2 * | 12/2010 | DiVergilio et al. | 118/723 I |
| 2003/0089315 A1 | 5/2003 | Matsuda et al. | |
| 2006/0110535 A1 | 5/2006 | Matsuda et al. | |
| 2008/0050537 A1 | 2/2008 | Godyak | |
| 2011/0133650 A1 * | 6/2011 | Kim | 315/111.21 |
| 2013/0043128 A1 * | 2/2013 | Ebe et al. | 204/298.06 |

FOREIGN PATENT DOCUMENTS

| | | |
|---|---|---|
| EP | 1 313 127 A1 | 5/2003 |
| EP | 1 727 186 A | 11/2006 |
| EP | 2 051 282 A2 | 4/2009 |
| JP | A-10-189293 | 7/1988 |
| JP | A-04-362091 | 12/1992 |
| JP | A-08-138888 | 5/1996 |
| JP | A-08-306500 | 11/1996 |
| JP | A-09-069399 | 3/1997 |
| JP | A-09-111460 | 4/1997 |
| JP | A-09-266174 | 10/1997 |
| JP | A-10-064697 | 3/1998 |
| JP | A-10-510095 | 9/1998 |
| JP | A-11-131244 | 5/1999 |
| JP | A-11-185996 | 7/1999 |
| JP | A-11-233289 | 8/1999 |
| JP | A-11-260596 | 9/1999 |
| JP | A-2000-164578 | 6/2000 |
| JP | A-2001-035697 | 2/2001 |
| JP | A-2003-147534 | 5/2003 |
| JP | A-2003-249452 | 9/2003 |
| JP | A-2005-079416 | 3/2005 |
| JP | A-2005-285564 | 10/2005 |
| JP | A-2006-185921 | 7/2006 |
| KR | 2003-0040131 | 5/2003 |
| TW | 2005 04815 A | 7/2003 |
| WO | WO 97/12502 A1 | 4/1997 |

OTHER PUBLICATIONS

Setsuhara, Yuichi, "Meter-Scale Large-Area Plasma Sources for Next-Generation Processes," Oct. 18, 2004, *Journal of Plasma and Fusion Research*, vol. 81, No. 2, Feb. 2005, pp. 85-93 (With Abstract).

Written Opinion of the International Searching Authority issued in Application No. PCT/JP2009/002234; Dated Aug. 18, 2009 (With Translation).

International Search Report issued in Application No. PCT/JP2009/002234; Dated Aug. 18, 2009 (With Translation).

May 2, 2013 Second Office Action issued in Chinese Application No. 200980117009.8 with English-language translation.

Office Action dated Jun. 25, 2013 issued in corresponding Taiwanese Patent Application No. 98117035 (with translation).

Japanese Submission of Publications etc. dated Aug. 26, 2013 issued in corresponding Japanese Patent Application No. 2003-249452 (with translation).

Ryo Taura et al., Planar-Type ICP Production Using Internal Antennas, 47$^{th}$ Applied Physics Conference Advance Proceedings, Mar. 20, 2000, 30a-C-6 (with translation).

Ryo Taura et al., Planar-Type ICP Production Using Internal Rectangular Antennas [2], 61$^{st}$ Applied Physics Academic Conference Advance Proceedings, Sep. 2, 2000, 4a-F-9 (with translation).

Japanese Submission of Publications etc. dated Mar. 22, 2013 issued in corresponding Japanese Patent Application No. 2010-512945 (with translation).

Office Action dated Oct. 22, 2013 issued in Taiwan Patent Application No. 98117035 (with English Translation).

Office Action dated Sep. 26, 2013 issued in Chinese Patent Application No. 200980117009.8 (with translations).

Extended European Search Report dated Oct. 4, 2013 issued in European Patent Application No. 09750378.3.

Office Action dated Jan. 7, 2014 issued in Japanese Patent Application No. 2010-512945 (with English Translation).

Office Action dated Feb. 27, 2014 issued in Chinese Patent Application No. 200980117009.8 (with English Translation).

Decision of Rejection dated Apr. 23, 2014 issued in Taiwanese Patent Application No. 98117035 (with English Translation).

Office Action dated Jul. 22, 2014 issued in Japanese Application No. 2010-512945 (with translation).

* cited by examiner (a)

(b)

(a) PLAN VIEW (b) SECTION AT A-A'

(c) ENLARGED VIEW

PLASMA GENERATION DEVICE AND PLASMA PROCESSING DEVICE

TECHNICAL FIELD

The present invention relates to a device for generating plasma, and also a plasma processing device for etching a substrate surface or producing a thin film by using plasma generated by the aforementioned device.

BACKGROUND ART

Plasma processing devices, such as plasma CVD (chemical vapor deposition) devices, dry-etching devices or ashing devices, are generally used in the process of producing semiconductor devices, liquid crystal displays, solar cells or other devices. In these devices, generation of high-density plasma covering a large area with a high level of uniformity is required for various purposes, such as dealing with large substrates, increasing the processing rate, and creating fine patterns. A plasma generation technique that is generally used for those purposes is a parallel-plate system. The parallel-plate system uses a pair of plate electrodes disposed parallel to each other in a vacuum container and generates plasma between them by applying a radio-frequency voltage to one plate electrode, while the other electrode is either connected to ground or applied with another radio-frequency voltage. This system is a so-called "capacitive coupled plasma (CCP)" system, which has an advantage in that it has a simple structure and yet can create approximately uniform plasma over the surface of the electrodes. The system also allows the use of large plate electrodes, so that even a large substrate can be processed relatively easily.

In recent years, plate electrodes have been extremely large to cope with the rapid increase in the size of glass substrates for display devices, causing a non-negligible degree of wavelength effect of the applied radio-frequency voltage. As a result, the electron density (plasma density) and other properties in the plane of the electrode plates have become noticeable. As one method for overcoming the drawbacks of the CCP system using a radio-frequency voltage, an inductively coupled plasma (ICP) system, which uses a small-sized antenna and a radio-frequency voltage, has been developed. ICP is generally known as a technique capable of producing high-density plasma with a low electron temperature and low ion energy even at lower gas pressures than used in the CCP system.

Patent Document 1 discloses a technique relating to ICP. The device disclosed therein includes a vacuum container for processing a substrate and another vacuum container for generating plasma (this container is hereinafter referred to as the "plasma chamber"), the two containers being connected with each other. The plasma chamber is made of a dielectric material, such as quartz glass or a ceramic, and a coil having a number of turns equal to or greater than one is wound around the plasma chamber. When a radio-frequency current is passed through this coil, an electric field is inducted within the plasma chamber. The induced electric field ionizes gas molecules within the plasma chamber, thus generating plasma. This technique can be classified as a plasma generation method using an external antenna. However, it has a problem due to the use of the dielectric plasma chamber: The dielectric container needs to be made of quartz glass, alumina or similar materials, which are rather low in mechanical strength and hence easy to be broken and hard to handle. This unfavorable characteristic also impedes the creation of large devices.

Patent Document 2 discloses a plasma generation device with an internal antenna. This internal antenna system includes a loop antenna provided in a vacuum container, with one end of the antenna connected via a matching box to a radio-frequency power source and the other end connected to ground either directly or via a capacitor. Similar to the device disclosed in Patent Document 1, plasma is generated when a radio-frequency current is passed through the antenna. In order to uniformly generate plasma over a large area within the vacuum container, the antenna needs to be extended along the inner wall of the vacuum container. However, this makes the antenna to have a length that approximates to the inner circumferential length of the vacuum container, increasing its impedance to radio-frequency waves. When, in this case, the radio-frequency current varies, the potential difference between the two ends of the antenna significantly changes, which results in a significant change in the plasma potential.

To solve such a problem, a non-loop antenna system using a wire conductor is disclosed in Patent Document 3. Furthermore, a system using a small-sized non-loop antenna to achieve low impedance has also been proposed (Non-Patent Document 1). It has been reported that, by using these techniques, high-density plasma having a low electron temperature can be generated under relatively low gas pressures. Additionally, the technique of distributing a plurality of antennas over an area is disclosed as a method for processing a large-sized substrate by using small-sized non-loop antennas.

In the non-loop antenna system, the antenna conductor is shaped as a pipe, through which cooling water is circulated to suppress the rise in temperature of the antenna due to the radio-frequency current. In this system, it is necessary to provide, at both ends of the pipe, a vacuum seal, a connector for the cooling water, and a connector for electrical connection to the radio-frequency power source or the ground. Such a configuration is not only complex but also causes problems, for example, in attaching or removing the antenna and in its maintenance and inspection. Attempting to achieve even lower impedance requires a larger diameter of the pipe of the antenna conductor so as to increase the passage area for the radio-frequency current. This causes the antenna conductor to have a larger radius of curvature, which is unfavorable, for example, in that the antenna needs to be longer.

It is generally known that superposing a magnetic field in the vicinity of the antenna is effective for generating stable plasma under low gas pressure or increasing the plasma density under high gas pressure. However, in the aforementioned structure with the antenna sticking inside the vacuum container, it is difficult to effectively apply a magnetic field to the plasma generation area in the vicinity of the antenna.

PRIOR ART DOCUMENTS

Patent Document

Patent Document 1: Japanese Unexamined Patent Application Publication No. H09-266174 (FIG. 1)
Patent Document 2: Japanese Unexamined Patent Application Publication No. H11-233289 (FIG. 1)
Patent Document 3: Japanese Unexamined Patent Application Publication No. 2001-035697 (FIG. 3)

Non-Patent Document

Non-Patent Document 1: J. Plasma Fusion Res. Vol. 81, No. 2 (2005) 85-93

DISCLOSURE OF THE INVENTION

Problem to be Solved by the Invention

One problem to be solved by the present invention is to provide a plasma generation device using a radio-frequency antenna that is simple in structure and hence easy to manufacture as well as easy to attach, remove, maintain and inspect, and also provide a plasma processing device using such a plasma generation device. The present invention also provides a plasma generation device and plasma processing device capable of easily applying a necessary magnetic field to the plasma generation area.

Means for Solving the Problems

A device according to the present invention aimed at solving the previously described problems is characterized by including:

a) a vacuum container;

b) an opening formed in a wall of the vacuum container; and c) a plate-shaped radio-frequency conductor attached so as to hermetically cover the opening.

In the plasma generation device of the present invention, the radio-frequency antenna is attached so as to cover the opening formed in a wall of the vacuum container. This structure is simple and hence easy to manufacture. Furthermore, the attachment, removal, maintenance and inspection of the antenna can be easily performed. The radio-frequency antenna conductor can efficiently radiate heat since it is shaped like a plate and exposed to the surrounding space of the vacuum container.

As the vacuum container, a metallic container is normally used since it can be easily manufactured yet provides necessary strength and, furthermore, it can be used for the grounding of the radio-frequency antenna. Accordingly, in the plasma generation device of the present invention, it is desirable to provide an insulator between the radio-frequency antenna conductor and the aforementioned wall surface. If a vacuum container made of an insulating material is used as described in Patent Document 1, it is unnecessary to use the aforementioned insulator.

There is no specific limitation on the planar shape of the radio-frequency antenna conductor; for example, it may be rectangular. When a rectangular radio-frequency antenna conductor is used, the radio-frequency power can be supplied as in the following examples: In the first example, one end in the longitudinal direction of the radio-frequency antenna is connected to a radio-frequency power source and the other end is connected to ground. This creates a uniform flow of radio-frequency current in the radio-frequency antenna conductor. In the second example, the radio-frequency power source is connected to the center of the radio-frequency antenna conductor, and both ends in the longitudinal direction of this conductor are connected to ground. In this case, the radio-frequency current flows between the center of the radio-frequency antenna conductor and each end of the same conductor. Therefore, by using a radio-frequency antenna conductor whose length is twice as large as that of the first example, it is possible to double the amount of current for the same impedance as in the case of the first example.

The plasma generation device of the present invention may have a structure in which a plurality of the aforementioned openings are provided and a radio-frequency antenna conductor is attached to each opening. By this configuration, extremely uniform plasma can be formed over a large area, so that the plasma processing of large substrates can be performed with even higher levels of uniformity.

In the plasma generation device of the present invention, a magnetic field generation means capable of generating a magnetic line of force having a magnetic field component perpendicular to the radio-frequency antenna conductor may be provided on the air-facing side of the radio-frequency antenna conductor. Both permanent magnets and electromagnets can be used as the magnetic field generation means. In the configuration of the present invention, the magnetic field generation means can be placed close to the radio-frequency antenna conductor, so that a magnetic field can be effectively applied to the plasma generation area.

In the present invention, it is preferable to provide a dielectric shield plate on the side of the radio-frequency antenna conductor that comes in contact with the plasma (i.e. on the side facing the inside of the vacuum container). This plate prevents the radio-frequency antenna conductor from direct contact with the plasma. In place of this dielectric shield plate, a dielectric coating may be formed on the vacuum-facing side of the radio-frequency antenna conductor. In the present invention, since the radio-frequency antenna conductor is exposed to the surrounding space of the vacuum container, the radio-frequency antenna conductor will be directly and efficiently cooled, so that the dielectric shield plate or dielectric coating will also be cooled efficiently. This means that even a material whose resistivity suddenly decreases with an increase in its temperature can be used as the material of the shield plate or coating. For example, a dielectric of oxide, nitride, carbide or fluoride can be used as the dielectric material.

The plate-shaped radio-frequency antenna conductor used in the present invention may preferably have a lower level of impedance on the surface thereof inside the vacuum container than on the air-facing surface thereof. This design increases the radio-frequency current flowing in the radio-frequency antenna conductor on the surface inside the vacuum container, so that the supplied radio-frequency power will be efficiently used for the plasma generation.

The plasma generation device according to the present invention can be used in various kinds of plasma processing devices, such as plasma CVD devices, dry-etching devices and ashing devices.

Effect of the Invention

The present invention makes it possible to obtain a plasma generation device using a radio-frequency antenna that is simple in structure and hence easy to manufacture as well as easy to attach, remove, maintain and inspect, and also a plasma processing device using such a plasma generation device.

Furthermore, by providing a magnetic field generation means on the air-facing side of the radio-frequency antenna conductor, it is possible to obtain a plasma generation device and plasma processing device capable of easily applying a necessary magnetic field to the plasma generation area.

BRIEF DESCRIPTION OF THE DRAWINGS

FIG. 11(a) is a schematic sectional view showing a radio-frequency antenna conductor and nearby components in which the surface of the radio-frequency antenna conductor facing the plasma chamber is coplanar with the inner wall surface of the vacuum container, and FIG. 11(b) is a schematic sectional view showing a radio-frequency antenna conductor and nearby components in which the surface of the radio-frequency antenna conductor facing the plasma chamber protrudes inwards from the inner wall surface of the vacuum container.

FIG. 16(a) is a schematic plan view of a radio-frequency antenna conductor and nearby components to which two pairs of radio-frequency power sources and matching boxes are connected, and FIG. 16(b) is a schematic plan view of a radio-frequency antenna conductor and nearby components to which only one pair of the radio-frequency power source and the matching box is connected.

BEST MODE FOR CARRYING OUT THE INVENTION

Figure 1:
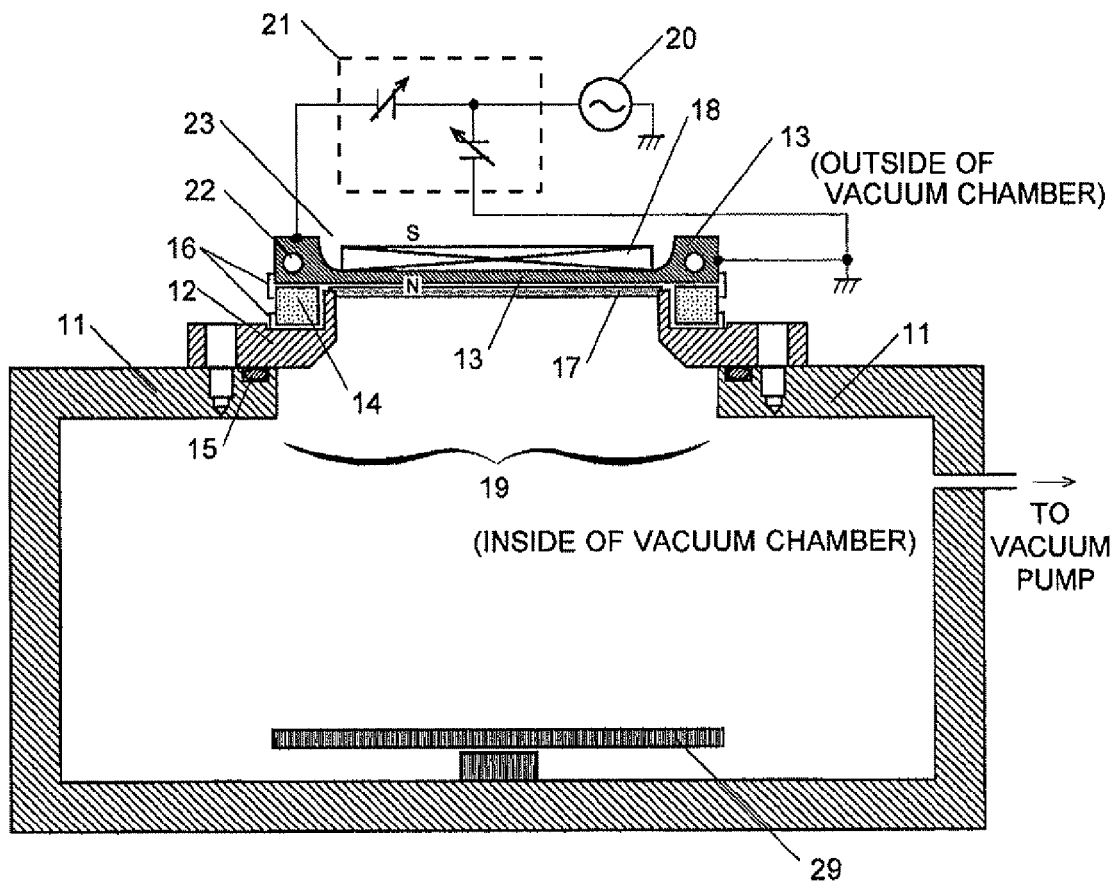
FIG. 1 is a schematic vertical sectional view showing the first embodiment of the plasma generation device according to the present invention.

Embodiments of the present invention are hereinafter described by means of FIGS. 1-3. FIG. 1 shows a schematic sectional view of a plasma generation device of the present invention. The plasma generation device according to the present embodiment includes a vacuum container 11, a flange 12, a radio-frequency antenna conductor 13 and an insulating frame 14. The radio-frequency antenna conductor 13 is plate shaped. An opening 19 is formed in a portion of the wall of the vacuum container 11. The flange 12 is fixed to this opening via a first vacuum seal 15 (e.g. an O-ring), and the radio-frequency antenna conductor 13 is placed on the flange 12. The insulating frame 14 with a second vacuum seal 16 surrounding the opening 19 are provided between the flange 12 and the radio-frequency antenna 13.

A dielectric shield plate 17 is provided on the vacuum-facing side of the radio-frequency antenna conductor 13 so as to cover the surface of the radio-frequency antenna conductor 13, while a magnetic field generator 18 is placed on the air-facing side. One end of the radio-frequency antenna conductor 13 is connected via a matching box 21 to a radio-frequency power source 20. The other end is connected to ground.

Additionally, when a substrate stage 29 is provided within the vacuum container 11, the plasma generation device of the present invention can be used as a plasma processing device for performing plasma CVD, dry etching, ashing or other processes on a substrate placed on the substrate stage 29.

First Embodiment

A plasma generation device of the first embodiment is hereinafter detailed with reference to FIG. 1. The radio-frequency antenna conductor 13 is a rectangular aluminum plate that approximately measures 60 mm in width and 120 mm in length. The vacuum-facing side of the radio-frequency antenna conductor 13 is flat, whereas the air-facing side has a hollow portion 23, in which the magnetic generation device 18 is placed. The radio-frequency antenna conductor 13 is thicker at its circumference than at the hollow portion 23. A water channel 22 for circulating cooling water is formed in the thicker portion of the conductor. In the present embodiment, the hollow portion 23 has a thickness of approximately 3 mm so as to enable a magnetic field to pass through the radio-frequency antenna conductor 13 and the dielectric shield plate 17 to the vacuum-facing side. Obviously, the thickness of the radio-frequency antenna conductor 13 is not limited to this value; it should be changed according to the required magnetic flux density, which depends on the size and residual magnetic flux density of the magnet, the distance from the magnet, and other factors.

As the material of the insulating frame 14, PEEK (polyether ether ketone, a polymer that consists of ether, ether and ketone combined in this order) is used. A sheet-shaped packing is provided between the insulating frame 14 and the radio-frequency antenna conductor 13 as well as between the insulating frame 14 and the flange 12, whereby the required insulating capability against radio-frequency waves and the required vacuum sealing are achieved. The material for the insulating frame 14 is not limited to the aforementioned one; it may be a ceramic, epoxy resin, DURACON, Teflon® or any other material that satisfies the requirements for the insulating capability against radio-frequency waves and the workability. The vacuum sealing packing may be a commonly used O-ring. The flange 12 and the radio-frequency antenna conductor 13 are tightly coupled by means of resin volts or metallic bolts via resin collars (not shown).

An output terminal of the matching box 21 is connected via a copper plate to the side face at one end of the radio-frequency antenna conductor 13 in the longitudinal direction. The other end is connected via a copper plate to the case of the matching box. This case is at the ground potential.

The plasma generation device having the previously described structure is neither an external antenna system nor an internal antenna system; similar to a flange generally used in a vacuum device, the radio-frequency antenna conductor 13 doubles as a part of the vacuum container 11. This configuration enables the separation of the vacuum seal, the cooling water channel 22, the connector for the cooling water, and the connector for supplying radio-frequency power. Another advantage exists in that the dielectric shield plate 17 for protecting the antenna conductor can be handled separately from the radio-frequency antenna conductor 13.

Unlike conventional radio-frequency antenna conductors, which have a structure created by bending a pipe or a three-dimensional structure created by winding a pipe, the radio-frequency antenna conductor according to the present invention has a two-dimensional structure. Therefore, even in the case of an antenna conductor with a comparable size, its inductance will be small, so that a lower level of impedance can be achieved. The high degree of design freedom for low impedance is also ensured by the fact that the width and length of the rectangle can be independently specified.

In the present embodiment, the electric field generated by the radio-frequency current passed through the radio-frequency antenna conductor 13 is in the direction along the long sides of the radio-frequency antenna conductor 13 and parallel to the conductor's surface. As the direction of a magnetic field orthogonal to this electric field, there are two possibilities, i.e. the direction parallel to the short sides of the radio-frequency antenna conductor 13 and the direction perpendicular to the conductor's surface. If the aforementioned electric field and a magnetic field are arranged in two directions that are parallel to the radio-frequency antenna conductor 13 and also perpendicular to each other, the electrons in the plasma will revolve in a plane perpendicular to both the magnetic field and the surface of the antenna conductor. Therefore, the probability of the electrons impinging on the conductor's surface is high, which results in a significant loss of electrons.

Figure 2:
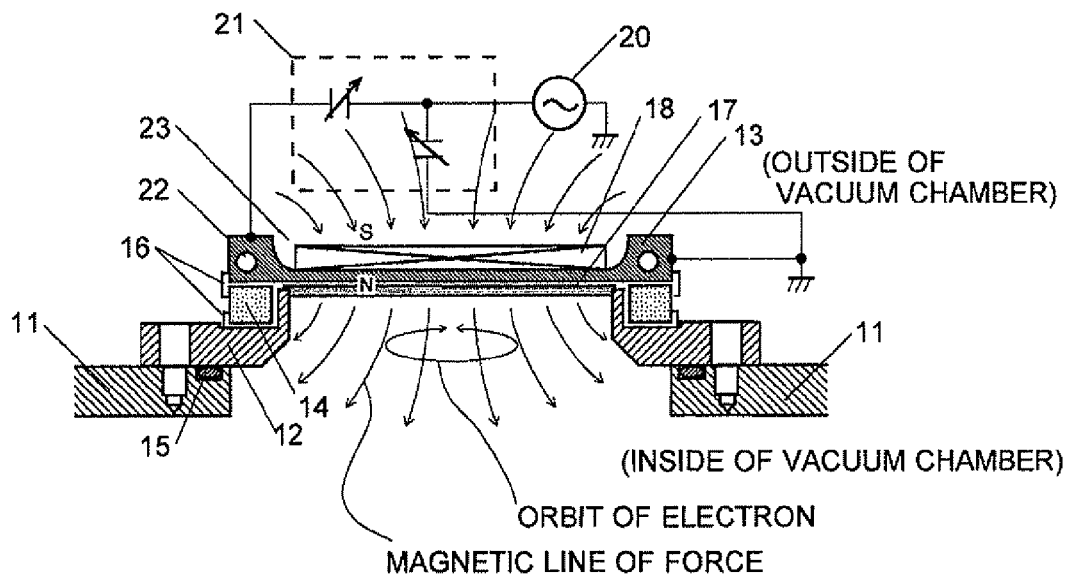
FIG. 2 is a schematic diagram showing the magnetic lines of force formed in the vicinity of a radio-frequency antenna conductor 13 in the first embodiment.

In the present embodiment, as indicated by the magnetic lines of force shown in FIG. 2, the aforementioned electric field parallel to the radio-frequency antenna conductor 13 is combined with a magnetic field perpendicular to the radio-frequency antenna conductor 13 to make the electrons in the plasma revolve in a plane parallel to the conductor's surface. Therefore, the probability of the electrons impinging on the conductor's surface is low, whereby the loss of electrons is reduced. As a result, high-density plasma is generated.

To realize such a magnetic field, a plate-shaped permanent magnet is provided on the air-facing side of the radio-frequency antenna conductor 13 and its orientation is adjusted so that its magnetization direction is parallel to the thickness direction of the radio-frequency antenna conductor 13. In order to apply an effective magnetic flux density to the plasma generation region on the vacuum-facing side of the radio-frequency antenna conductor 13, the thickness of the radio-frequency antenna conductor 13 at the portion where the magnet is placed (i.e. at the hollow portion) should preferably be within a range from 3 mm to 25 mm. By this design, the flux density of the magnetic field in the vicinity of the vacuum-facing side of the antenna conductor will be within a range from several Gauss to several hundred Gauss, which is effective for plasma generation. Such a magnetic field can be created by means of not only a permanent magnet but also a magnetic field generation means using an air-core coil or other types of electromagnets.

In the present embodiment, the shield plate 17 made of quartz is provided on the vacuum-facing side of the radio-frequency antenna conductor 13. This shield plate is used for preventing direct contact between the generated plasma and the surface of the radio-frequency antenna conductor. If the plasma comes in contact with the surface of the antenna conductor, the antenna conductor will have a negative potential with respect to the plasma, causing the sputtering of the material of the antenna conductor due to collision of accelerated ions, which would result in harmful impurities being mixed in the electric discharge gas. The shield plate 17 prevents such a mixture of impurities.

The material of the dielectric shield plate 17 is not limited to quartz. For example, it is possible to use a high-purity silicon plate, alumina, yttria or silicon carbide. Instead of using the shield plate, the surface of the radio-frequency antenna conductor 13 facing the inside of the vacuum container may be directly coated with any of those dielectric materials.

Second Embodiment

Figure 3:
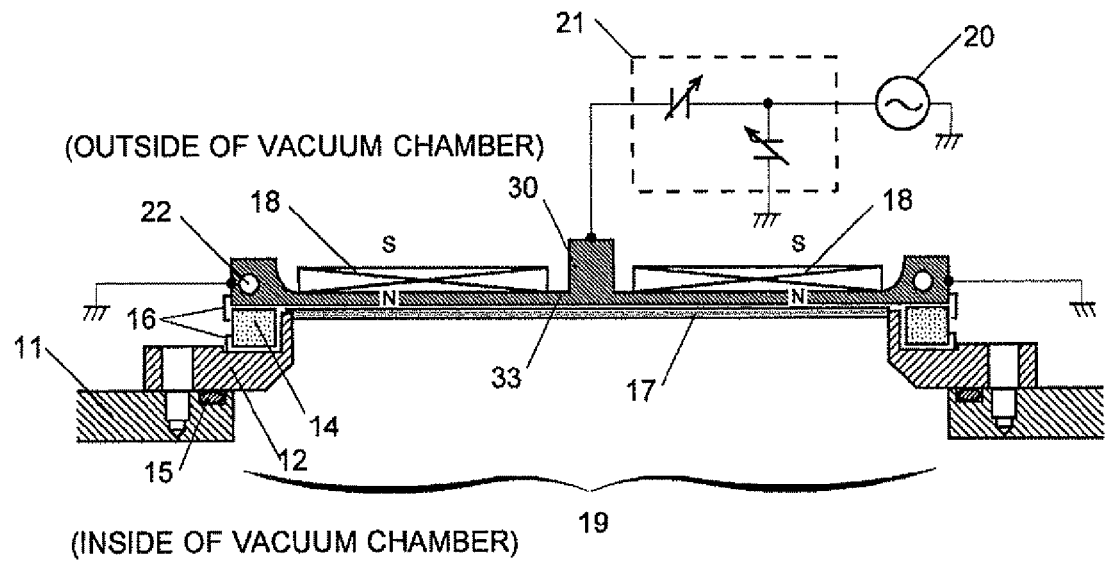
FIG. 3 is a schematic vertical sectional view showing the configuration of the radio-frequency antenna conductor 33 and nearby components in the second embodiment of the plasma generation device according to the present invention.

Regarding the configuration of the radio-frequency antenna and nearby components in a plasma generation device of the second embodiment, a schematic sectional view of the main components is shown in FIG. 3. The plasma generation device of the present embodiment has basically the same configuration as that of the first embodiment except for the radio-frequency antenna conductor 33 and the wiring for supplying power to the radio-frequency antenna conductor 33. The radio-frequency antenna conductor 33 has a length that approximately doubles the length of the radio-frequency antenna conductor 13 of the first embodiment. Furthermore, a projection 30 for supplying radio-frequency power is provided at its center, and both ends are connected to ground. A radio-frequency power is supplied via the matching box to the projection 30 so that radio-frequency current flows from the center to the two ends connected to ground.

According to the present embodiment, it is possible to approximately double the plasma generation area without increasing the antenna impedance.

The radio-frequency antenna in the first or second embodiment can be provided, for example, at a plurality of positions at predetermined intervals in the top plate of the plasma generation device, whereby a large-area plasma generation device or plasma processing device can be provided at low cost.

Third Embodiment

Figure 4:
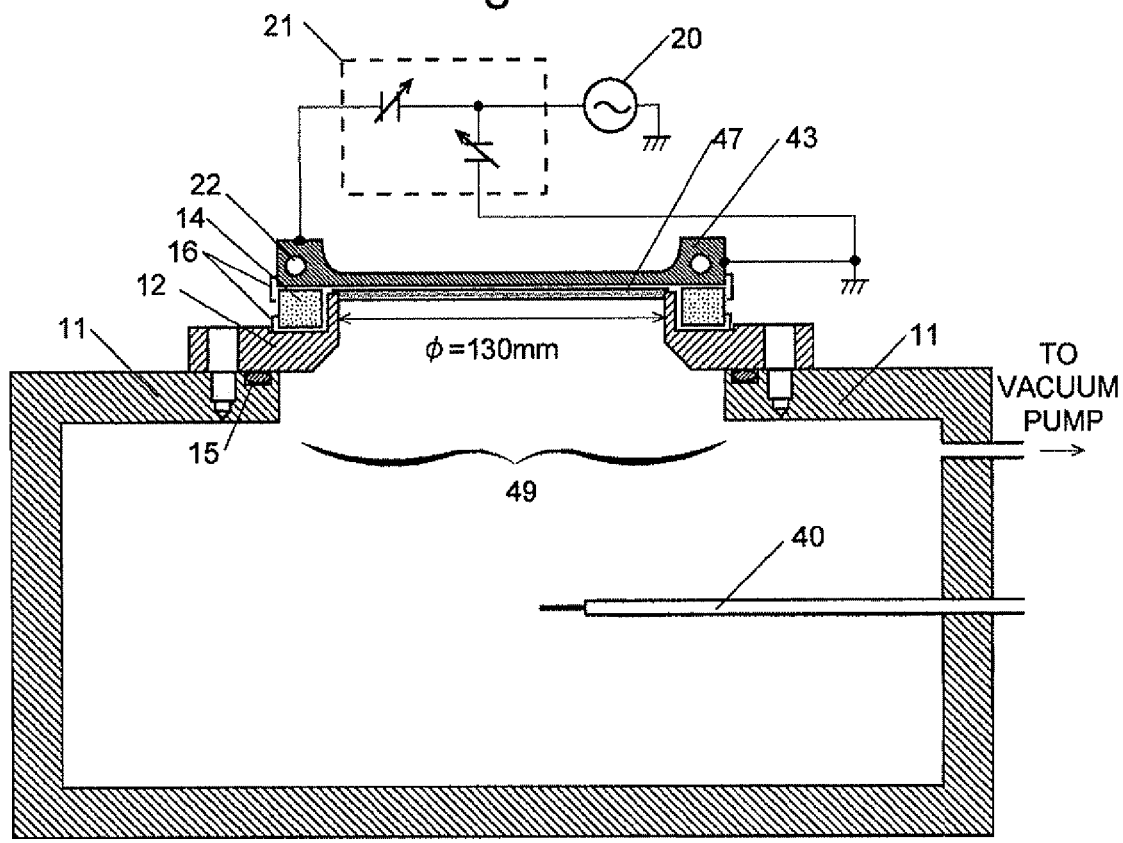
FIG. 4 is schematic vertical sectional view showing the third embodiment of the plasma generation device according to the present invention.

Regarding the configuration of the radio-frequency antenna and nearby components in a plasma generation device of the third embodiment, a schematic sectional view of the main components is shown in FIG. 4. The present embodiment has basically the same configuration as that of the first embodiment except for the use of a radio-frequency antenna conductor 43, which consists of an aluminum disc having a diameter of 180 mm (with a plasma generation area having a diameter of 130 mm). It should also be noted that the magnetic field generator used in the first embodiment is not used in the present embodiment. For consistency with the shape of the radio-frequency antenna conductor 43, the insulating frame 44 is transformed from the first embodiment to a ring-like circular shape, the dielectric shield plate 47 to a disc shape, and the opening 49 to a circular shape. A radio-frequency power source (frequency: 13.56 MHz) is connected via a matching box to a point (power supply point) on the circumference of the disc of the radio-frequency antenna conductor 43. This conductor is grounded at an end point of the disc on the diameter passing through the power supply point.

The following experiment was conducted using the plasma generation device of the third embodiment.

First, the vacuum container 11 was evacuated to a pressure lower than $1.0 \times 10^{-3}$ Pa, after which 100 ccm of argon gas was introduced from a gas introduction unit (not shown) into the vacuum container 11 so as to control the pressure inside the vacuum container 11 to be 10 Pa. Subsequently, radio-frequency power was supplied to the radio-frequency antenna conductor 43 to generate plasma in the vacuum container. Then, the characteristics of this plasma were measured with a Langmuir probe 40 installed in the vacuum container 11.

Figure 5:
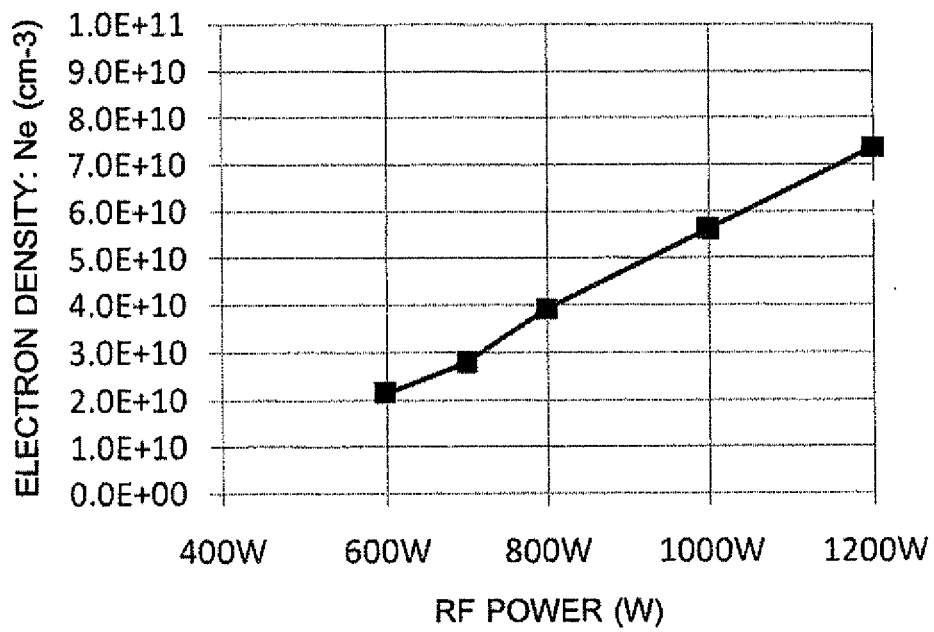
FIG. 5 is a graph showing the electron density of plasma generated by the plasma generation device of the third embodiment.
Figure 6:
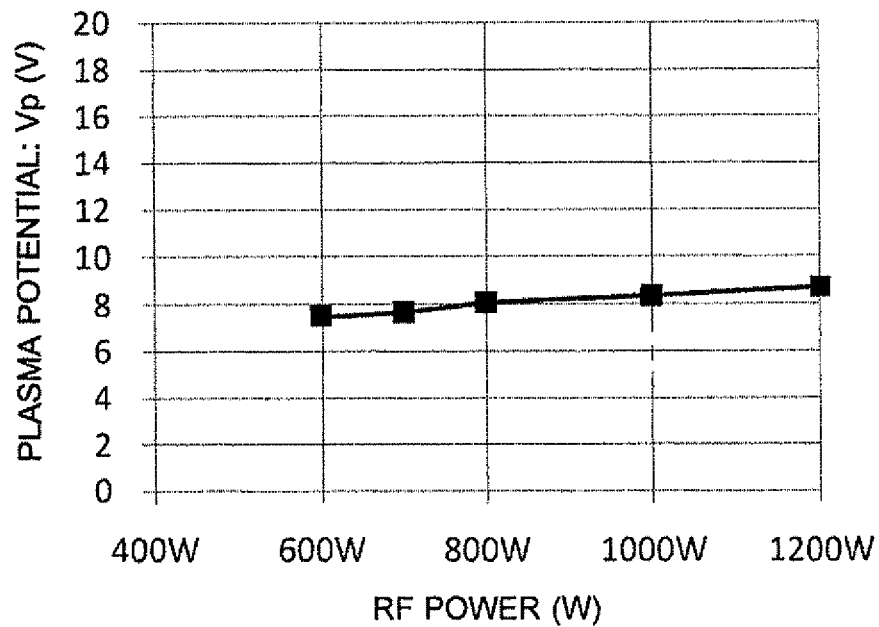
FIG. 6 is a graph showing the plasma potential of plasma generated by the plasma generation device of the third embodiment.
Figure 7:
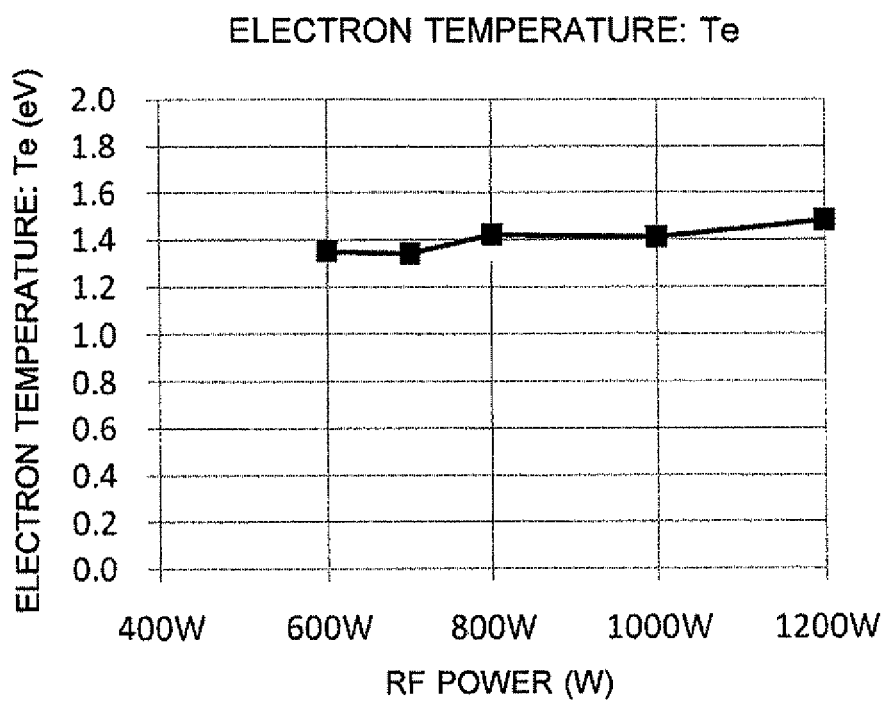
FIG. 7 is a graph showing the electron temperature of plasma generated by the plasma generation device of the third embodiment.

The results of this measurement are shown in FIGS. 5-7. As shown in FIG. 5, the electron density linearly increased in a graph in which the electron density is plotted against the radio-frequency power input (RF power). The electron density recorded a high value of $7.5 \times 10^{10}$ (cm$^{-3}$) when the radio-frequency power was at 1000 W, which was the maximum value of the power within the measured range. On the other hand, both the plasma potential (FIG. 6) and the electron temperature (FIG. 7) were at almost constant levels regardless of the radio-frequency power; the plasma potential was 8V and the electron temperature was 1.4 eV, both of which are extremely low. Such plasma properties are characteristically observed when the plasma is generated by a low-inductance radio-frequency antenna. Thus, it was confirmed that high-density, less damaging plasma could be generated by the plasma generation device of the present invention.

Fourth Embodiment

Figure 8:
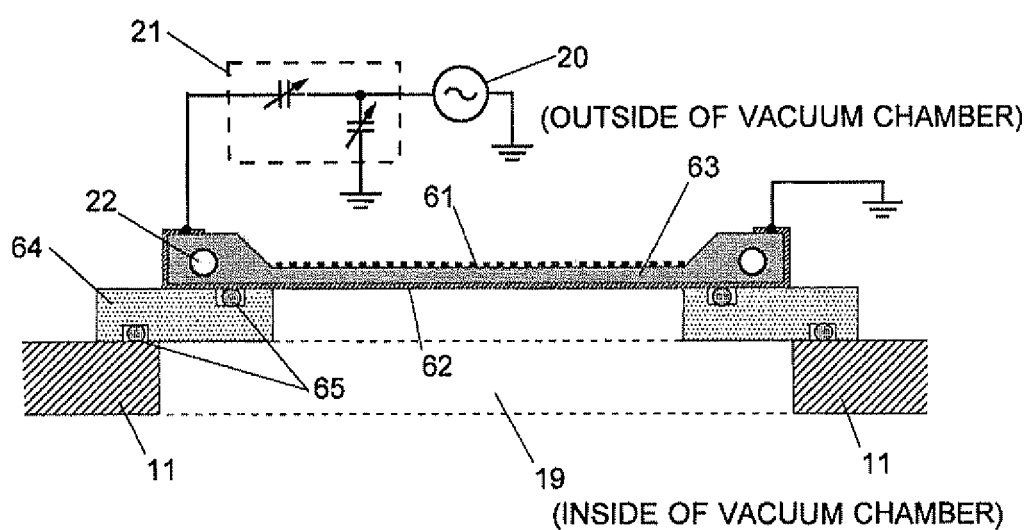
FIG. 8 is schematic vertical sectional view showing the fourth embodiment of the plasma generation device according to the present invention.

Regarding the configuration of the radio-frequency antenna and nearby components in a plasma generation device of the fourth embodiment, a schematic sectional view of the main components is shown in FIG. 8. The present embodiment has basically the same configuration as that of the first embodiment; major differences exist in that an insulating frame 64 is directly used as a flange in place of the flange 12, and that the radio-frequency antenna conductor 63 has a concavo-convex portion 61 formed on the outer surface (i.e. the surface on the air-facing side of the vacuum container) and also has a copper foil attached to the inner surface (i.e. the surface facing the inside of the plasma chamber).

As shown in FIG. 8, a plurality of grooves (concavo-convex portion 61) perpendicular to the longitudinal direction of the radio-frequency antenna conductor 63 are formed on the outer surface of this antenna conductor. As a result, high impedance is created against the propagation of a radio-frequency current on the outer surface of the radio-frequency antenna conductor 63. On the other hand, the presence of the copper foil 62, which is a low resistivity member, creates low impedance against the propagation of the radio-frequency current on the inner surface of the radio-frequency antenna conductor 63. This difference in impedance between the outer and inner surfaces of the radio-frequency antenna conductor 63 results in an increase in the radio-frequency current flowing on the inner surface of the radio-frequency antenna conductor, so that the supplied radio-frequency power will be efficiently used for generating plasma.

The impedance can be further decreased by increasing the thickness of the copper foil 62 on the inner surface of the radio-frequency antenna conductor 63 to be greater than the depth to which the skin effect on the radio-frequency current can work. Additionally, it is also possible to extend the copper foil 62 so that it covers not only the inner surface of the radio-frequency antenna conductor 63 but also a power-supply portion through which electric power is supplied to the radio-frequency antenna conductor. In this case, almost entirety of the radio-frequency current flows through the copper foil, so that plasma will be generated more efficiently. In the present embodiment, the thickness of the copper foil was 100 μm, and the power-supply portion was connected to the copper foil 62. A power source having a frequency of 13.56 MHz and a maximum output of 3 kW was used as the radio-frequency power source 20.

The following experiment was conducted using the plasma generation device of the fourth embodiment.

First, the vacuum container 11 was evacuated to a pressure lower than $1.0 \times 10^{-3}$ Pa, after which 100 ccm of argon gas was introduced from a gas introduction unit (not shown) into the vacuum container so as to control the pressure inside the vacuum container 11 to be 1.33 Pa. Subsequently, radio-frequency power was supplied to the radio-frequency antenna conductor 63 to generate plasma in the vacuum container. Then, the density of the generated plasma was measured with a Langmuir probe (not shown) installed in the vacuum container.

Figure 9:
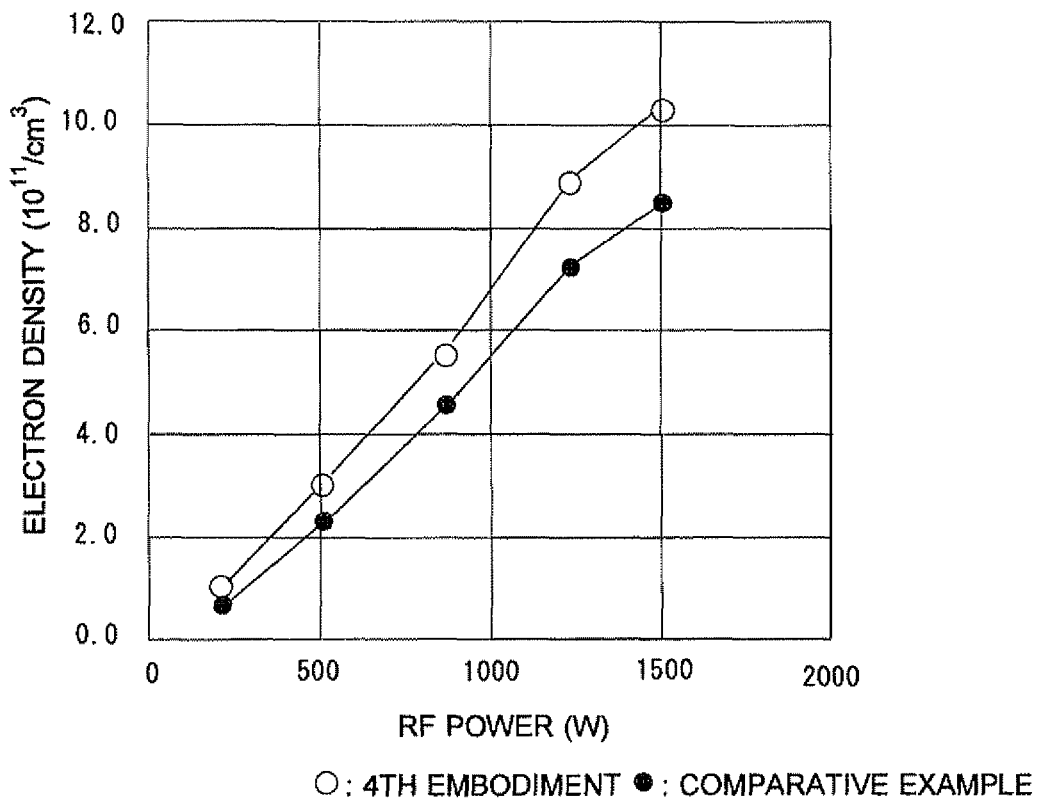
FIG. 9 is a graph showing the electron density of plasma generated by the plasma generation device of the fourth embodiment.
Figure 9:
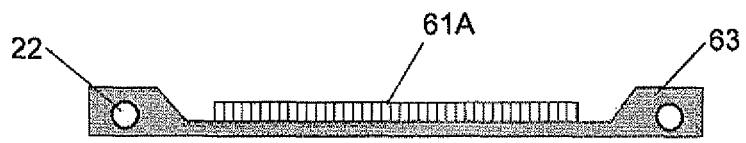

The measured result of the electron density inside the plasma chamber at a distance of 80 mm from the surface of the antenna conductor is shown in FIG. 9. The electron density increased substantially in proportion to the radio-frequency power. When the radio-frequency power was 1.5 kW, the electron density was $1.02 \times 10^{12}$ (cm$^{-3}$). The radio-frequency wave absorption efficiency was approximately 80%. A comparative experiment was also conducted using a radio-frequency antenna conductor with both sides equally completed, which resulted in an electron density of $0.84 \times 10^{12}$ (cm$^{-3}$). Comparison of the two results revealed that the electron density increased by approximately 22%.

Figure 10:
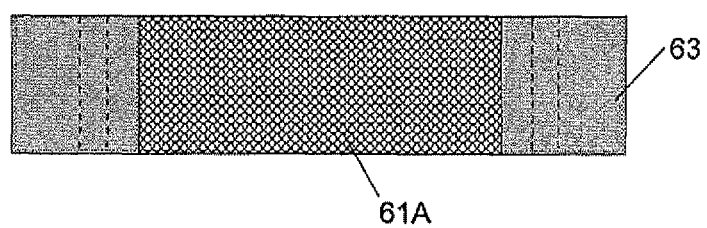
FIG. 10(a) is a schematic vertical sectional view showing another configuration of the radio-frequency antenna conductor in the fourth embodiment.
FIG. 10(b) is a schematic plan view of the same configuration.

In the present embodiment, a plurality of grooves perpendicular to the longitudinal direction of the radio-frequency antenna conductor 63 are formed on the outer side of the radio-frequency antenna conductor. This is not the only possible method for forming a concavo-convex structure on the conductor's surface. Any machining method may be used as long as it can create a form that creates high impedance against the propagation of a radio-frequency current. For example, as shown in FIGS. 10(*a*) and 10(*b*), the propagation of the radio-frequency current can be suppressed by forming a honeycomb pattern 61A on the outer surface of the radio-frequency antenna conductor 63. The honeycomb-pattern structure is also advantageous in that a light-weight antenna conductor can be created while maintaining the mechanical strength.

It is possible to use an iron-chrome alloy with high resistivity (e.g. stainless steel) as the substrate of the radio-frequency antenna conductor and form a low-resistivity metallic layer on necessary portions of this substrate. It is also possible to use a ceramic or similar insulating material as the substrate of the radio-frequency antenna conductor and form a low-resistivity metallic layer on the inner surface of the substrate. This configuration is extremely effective in generating high-density plasma since it allows the radio-frequency current to flow only on the inner surface of the radio-frequency antenna conductor. Examples of the ceramic material include quartz, alumina, silicon carbide and other kinds of oxides, nitrides, carbides and fluorides.

Fifth Embodiment

Figure 11:
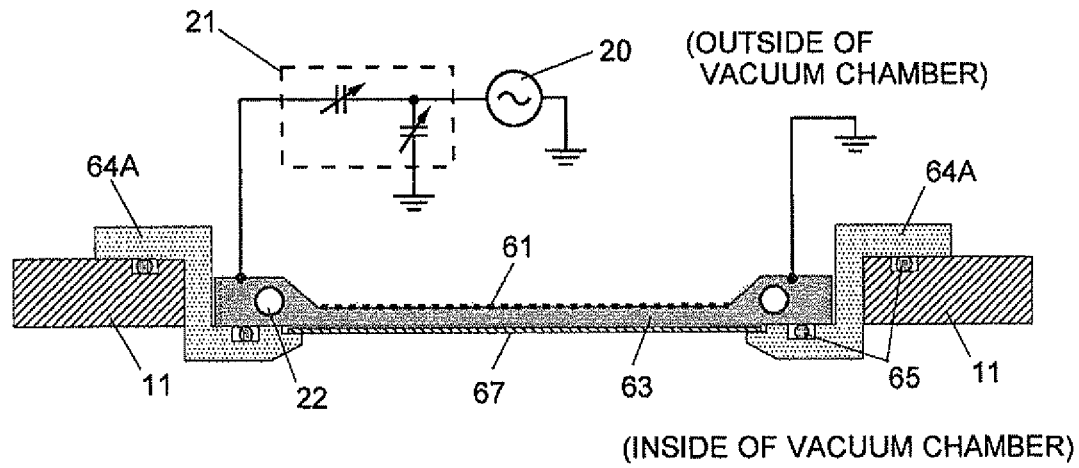
FIGS. 11(a) and 11(b) show the fifth embodiment of the plasma generation device according to the present invention.
Figure 11:
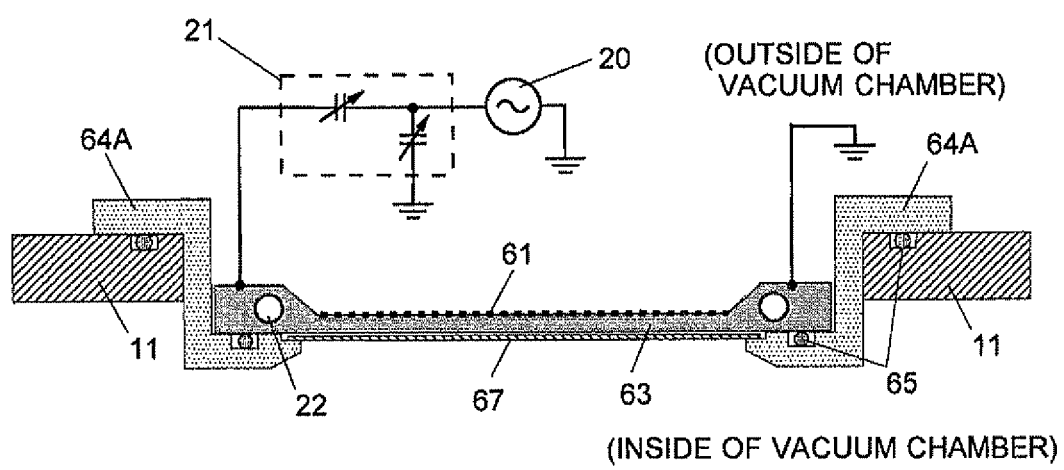

Regarding the configuration of the radio-frequency antenna and nearby components in a plasma generation device of the fifth embodiment, a schematic sectional view of the main components is shown in FIGS. 11(*a*) and 11(*b*). The present embodiment has basically the same configuration as that of the fourth embodiment; one difference exists in that an insulating frame 64A, whose shape differs from that of the fourth embodiment, is fitted into an opening formed in the wall of the vacuum container. The inner surface of the radio-frequency antenna conductor 63 is mirror finished to decrease the impedance on the inner surface of the radio-frequency antenna conductor 63. The radio-frequency antenna conductor 63 and the insulating frame 64A are fixed to each other with a vacuum seal 65 in between. This configuration allows the inner surface of the radio-frequency antenna conductor 63 to be level with the inner wall surface of the vacuum container (FIG. 11(*a*)) or projected from the inner wall surface of the vacuum container into the plasma chamber (FIG. 11(*b*)), whereby high-density plasma can be efficiently generated in the plasma chamber. It also facilitates the attachment and removal of the radio-frequency antenna conductor 63 as well as the maintenance and inspection of the device.

In the present invention, the shield plate 67, which is a high-purity n-type silicon plate with a thickness of 0.6 mm and a resistivity of 1000-4000 Ωcm, is clamped onto the inner surface of the radio-frequency antenna conductor 63 by the insulating frame 64A. The change in the radio-frequency power absorption efficiency due to the use of a silicon plate as the shield plate is as small as 2% or even less. Therefore, it has only minor influences and can prevent direct contact between the radio-frequency antenna conductor and the plasma. Using a high-purity silicon plate in this manner prevents the sputtering of the antenna conductor material. Furthermore, in the case of creating a polysilicon film, the mixture of impurity atoms due to the sputtering of the shield plate can be avoided by using a silicon plate. The shield plate 67 is not limited to a high-purity silicon plate; a dielectric plate, such as a quartz plate, may also be used. It is also possible to use a dielectric plate covered with a high-purity silicon film.

In the plasma generation device according to the present invention, the insulating frame 64A and the plate-shaped radio-frequency antenna conductor 63 provide a structural strength for resisting the pressure difference between inside and outside the vacuum chamber. Therefore, the shield plate 67, which is provided on the inner surface of the radio-frequency antenna conductor, does not need to be mechanically strong; it may be an extremely thin dielectric plate or layer. Use of such a dielectric plate or layer reduces the power loss and thereby effectively improves the plasma generation efficiency. The use of the structure for fitting the radio-frequency antenna conductor 63 and the insulating frame 64A in the opening 19 formed in the wall of the vacuum container 11 reduces the electric capacitance between the radio-frequency antenna conductor and the vacuum container and thereby suppress the loss of radio-frequency power due to capacitive coupling.

Sixth Embodiment

Figure 12:
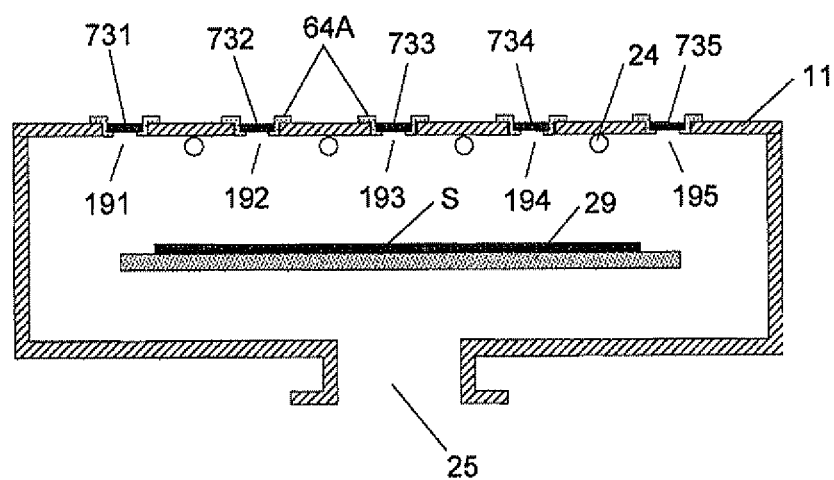
FIG. 12 is a schematic sectional view showing the sixth embodiment of the plasma generation device according to the present invention.

A schematic sectional view of a plasma generation device according to the sixth embodiment of the present invention is shown in FIG. 12. The plasma generation device of the present embodiment includes five rectangular openings 191-195 arranged almost parallel to each other in the top plate of the vacuum container 11, with radio-frequency antenna conductors 731-735 being attached to those openings via the insulating frame 64A, respectively. The material gas for plasma generation is supplied through small holes (not shown) formed in the wall of the gas pipes 24 extending into the vacuum container. The inside of the vacuum container 11 is evacuated by a vacuum pump (not shown) connected to an exhaust port 25. A substrate support 29 is provided within the vacuum container 11, on which a substrate S is placed. If necessary, the substrate support 29 may be provided with a heater (not shown) for heating the substrate to regulate the temperature of the substrate.

Figure 13:
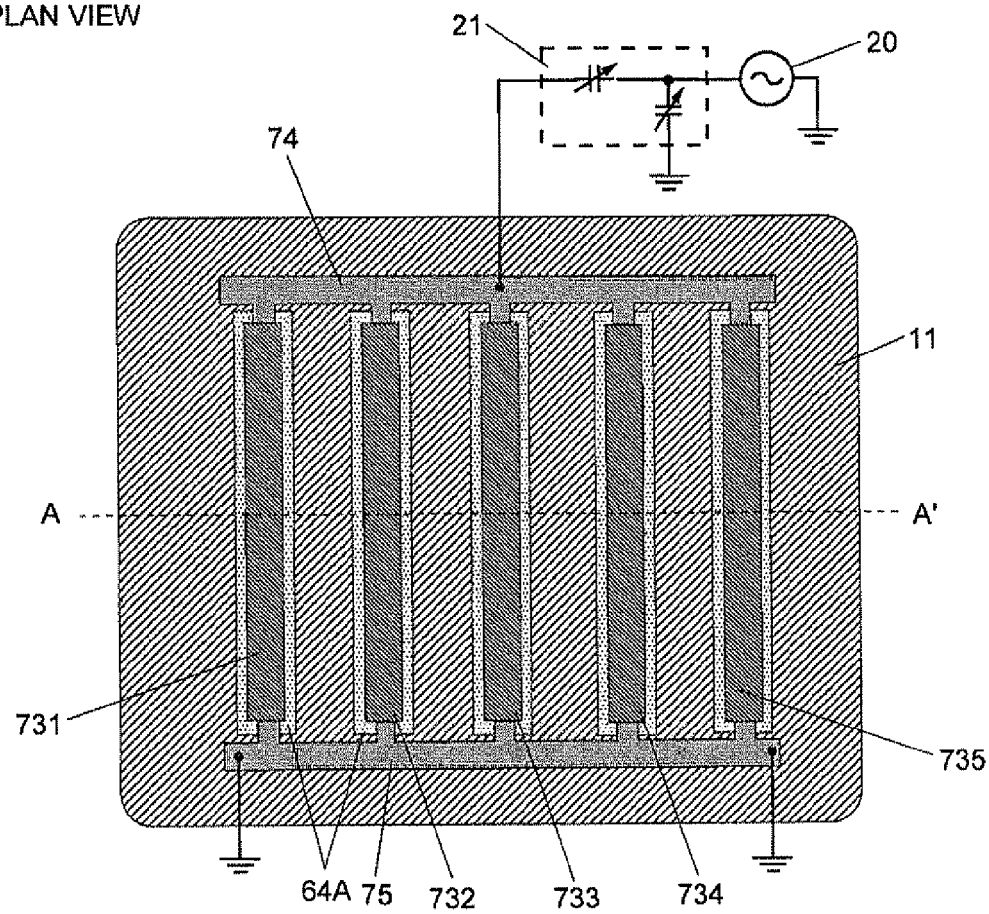
FIGS. 13(a)-13(c) are a schematic plan view, a schematic sectional view and an enlarged view of the radio-frequency antenna conductor and nearby components in the sixth embodiment, respectively.
Figure 13:
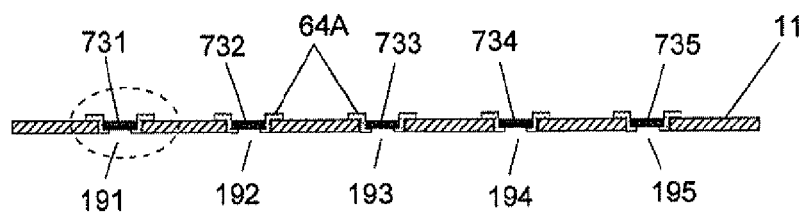
Figure 13:
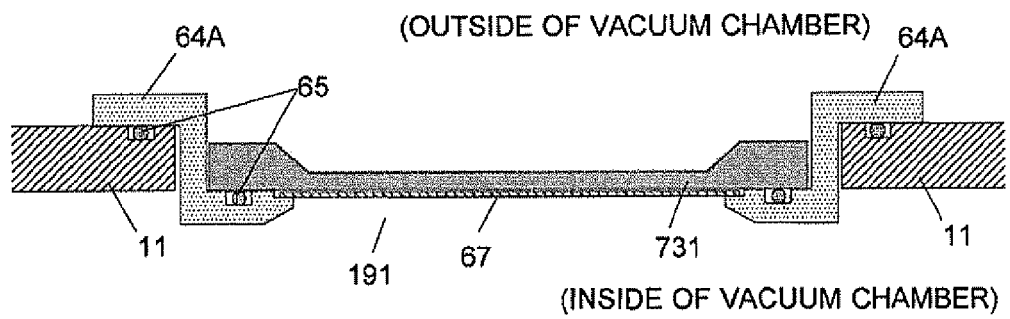

Regarding the configuration of the radio-frequency antenna and nearby components in a plasma generation device of the sixth embodiment, schematic views of the main components are shown in FIG. 13. Specifically, FIG. 13 shows (a) a schematic plan view, (b) a sectional view at line A-A' and (c) an enlarged partial sectional view of the radio-frequency antenna conductor and nearby components, respectively.

As shown in FIG. 13(*a*), the five radio-frequency antenna conductors 731-735 each have one end electrically connected to a copper-made power-supply bar 74, being supplied with radio-frequency power from the radio-frequency power source 20 (13.56 MHz), which is connected to the center of the power-supply bar 74 via the matching box 21. The other ends of the radio-frequency antenna conductors 731-735 are electrically connected to one another by a copper-made grounding bar 75. Both ends of the grounding bar 75 are connected to the top plate of the vacuum container 11, which is at a ground potential.

The previously described connection gives substantially the same length to the current channels of the radio-frequency current flowing through the radio-frequency antenna conductors 731-735, including the power-supply bar 74 and the grounding bar 75. Accordingly, the radio-frequency antenna conductors 731-735 have approximately the same impedance, so that they will create plasma with uniform density in the plasma chamber. According to the present invention, it is possible to produce almost uniform flows of radio-frequency current through a plurality of antenna conductors by means of only one pair of the radio-frequency power source and the matching box. Thus, an inexpensive plasma generation device can be provided. A plurality of radio-frequency antenna conductors combined together as one set is hereinafter referred to as a "radio-frequency antenna structure."

It should be noted that the configuration of the radio-frequency antenna conductor 731 and nearby components shown in FIG. 13(*c*) is the same as that of the fifth embodiment except that no concavo-convex portion is formed on the outer surface of the radio-frequency antenna conductor 731. The inner surface of the radio-frequency antenna conductor 731 is level with the inner wall surface of the vacuum container.

Figure 14:
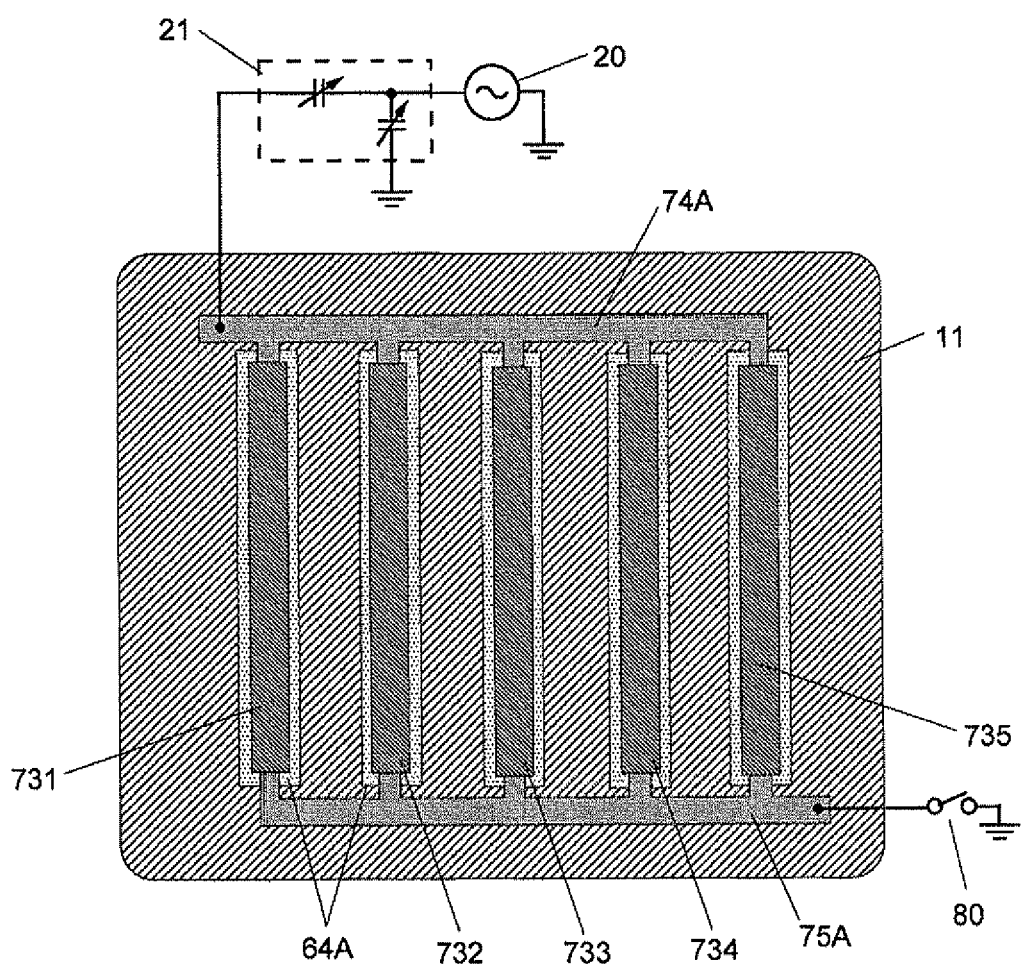
FIG. 14 is a schematic plan view showing another configuration of the radio-frequency antenna conductor and nearby components in the sixth embodiment.

A modified example of the present embodiment is shown in FIG. 14. In FIG. 14, the five radio-frequency antenna conductors are electrically connected to each other by the power-supply bar 74A at one end and by the grounding bar 75A at the other end. The radio-frequency power source 20 is connected to one end of the power-supply bar 74A via the matching box 21. The point where the grounding bar 75A is connected to ground is located at an end near the radio-frequency antenna conductor 735, which is the farthest from the radio-frequency antenna conductor 731 located near the point where the radio-frequency power source 20 is connected. Such a configuration gives approximately the same impedance to the radio-frequency antenna conductors 731-735 and thereby produces almost the same radio-frequency current flowing through any of the radio-frequency antenna conductors.

Furthermore, as shown in FIG. 14, the grounding bar 75A is grounded via a mode-changing switch 80. By turning off this mode-changing switch 80, the radio-frequency antenna conductors 731-735 can be released from the grounded state, whereby the mode of plasma is changed from inductively coupled plasma to capacitively coupled plasma. Changing the mode of plasma to capacitively coupled plasma exerts the effect of facilitating the removal of substances deposited on the surface of the radio-frequency antenna conductors or the shield plate. Returning the mode-changing switch 80 from the OFF state to the ON state resets the mode of plasma from the capacitively coupled plasma to the inductively coupled plasma. The operation of switching the grounded state of the radio-frequency antenna conductors for changing the mode of plasma can also be performed in the other embodiment.

Seventh Embodiment

Figure 15:
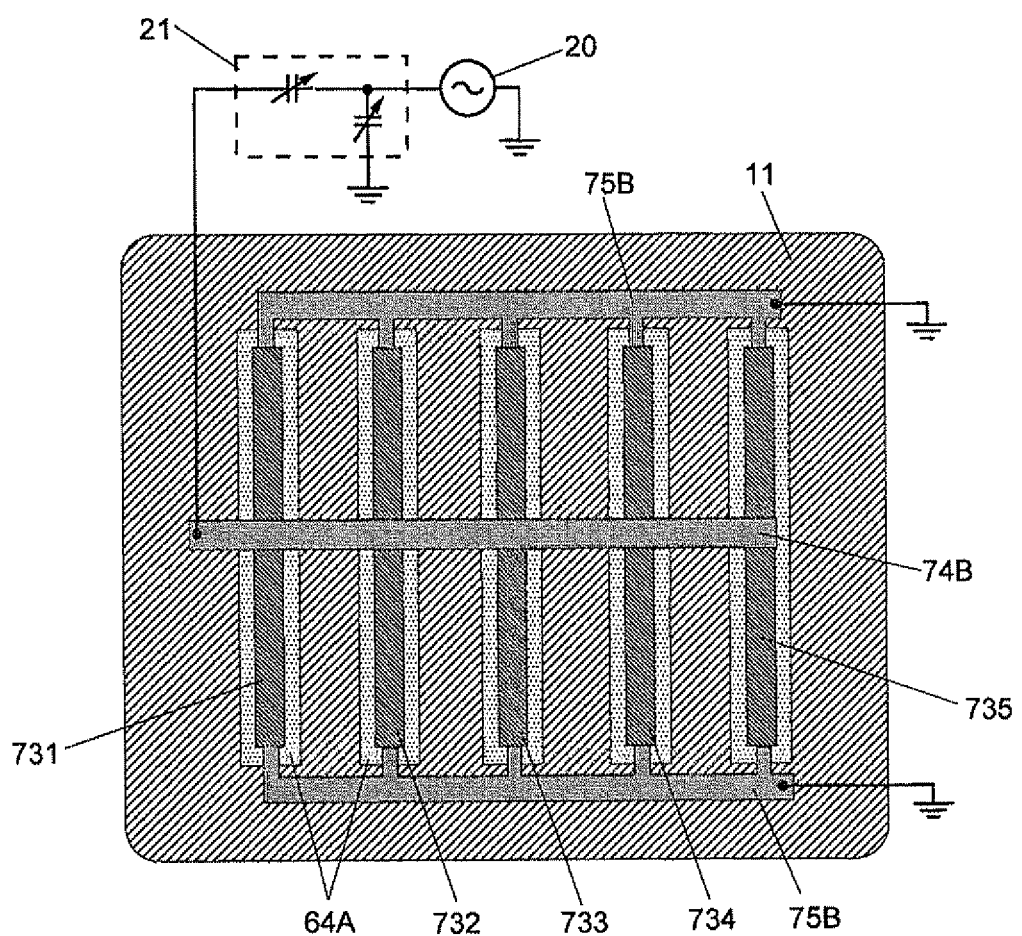
FIG. 15 is a schematic plan of the radio-frequency antenna conductor and nearby components in the seventh embodiment of the plasma generation device according to the present invention.

Regarding the configuration of the radio-frequency antenna structure in the seventh embodiment, a schematic plan view of the main components is shown in FIG. 15. In the present embodiment, the longitudinal length of the radio-frequency antenna conductors 731-735 is doubled to 120 mm as compared to the length in the sixth embodiment. The five rectangular openings 191-195 and five rectangular radio-frequency antenna conductors 731-735 are arranged almost parallel to one another at constant intervals. The centers of the radio-frequency antenna conductors 731-735 are electrically connected to one another by a power-supply bar 7413, while both ends of the radio-frequency antenna conductors 731-735 are electrically connected to one another by grounding bars 75B. The radio-frequency power source 20 is connected to one end of the power-supply bar via the matching box 21. The point at which the grounding bar 75B is connected to ground is located at an end near the radio-frequency antenna conductor 735, which is the farthest from the radio-frequency antenna conductor 731 located near the point where the radio-frequency power source 20 is connected. Such a configuration gives approximately the same impedance to the radio-frequency antenna conductors 731-735 including the power-supply bar and the grounding bar, and thereby creates almost the same radio-frequency current flowing through any of the radio-frequency antenna conductors. Furthermore, this configuration also makes it possible to approximately double the plasma generation area without increasing the impedances of the radio-frequency antenna conductors.

Figure 16:
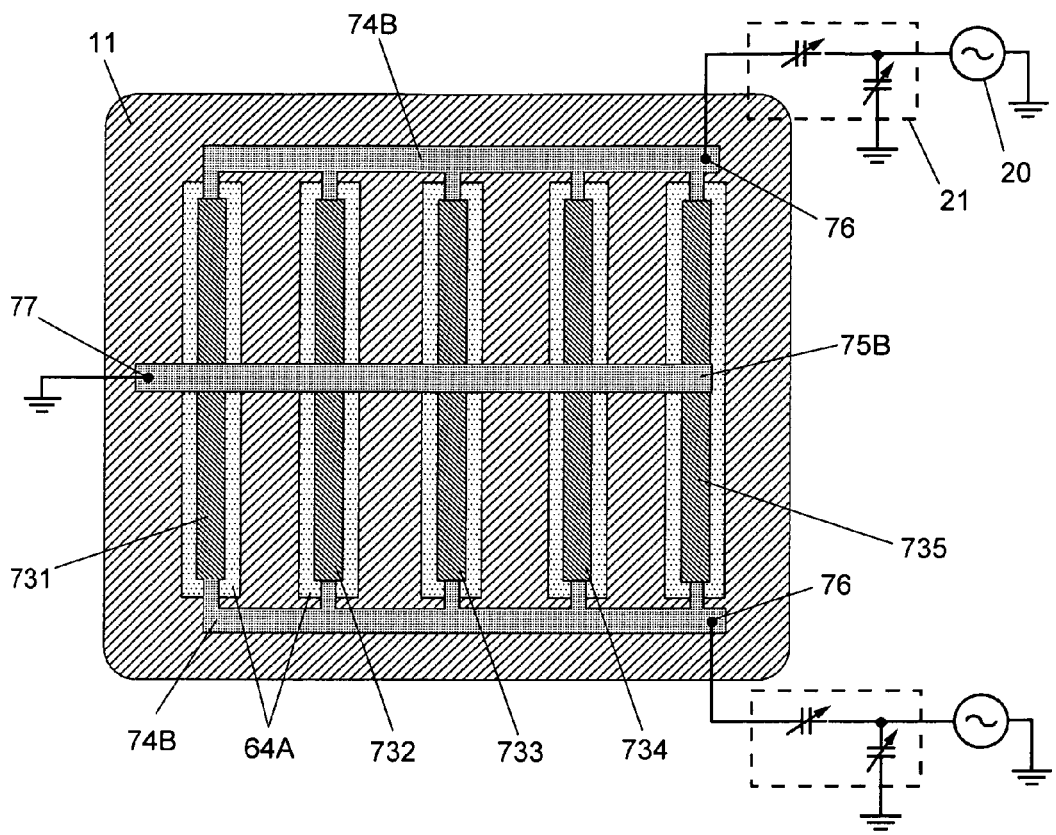
FIGS. 16(a) and 16(b) show the first modified example of the seventh embodiment.
Figure 16:
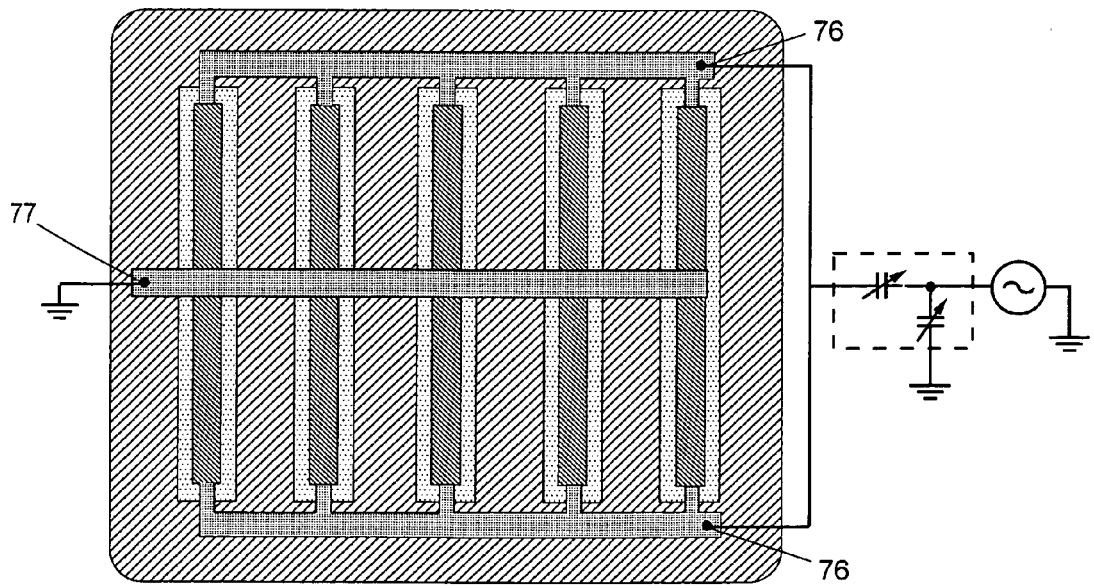

As a first variation of the present embodiment, the power-supply bar and the grounding bars in the radio-frequency antenna structure shown in FIG. 15 may be transposed. In this case, the structure will have one grounding bar and two power-supply bars, which means that there is one grounding point 77 on the grounding bar and two power-supply points 76 on the power-supply bars (FIGS. 16(a) and 16(b)). The radio-frequency power source and the matching box may be provided for each power-supply point 76, as shown in FIG. 16(a), or the same pair of the radio-frequency power source and the matching box may be commonly connected to both power-supply points, as shown in FIG. 16(b). Similar to the previous embodiment, any of the present configurations gives approximately the same impedance to the radio-frequency antenna conductors 731-735 including the power-supply bars and the grounding bar, and thereby produces almost the same radio-frequency current flowing through any of the radio-frequency antenna conductors.

Figure 17:
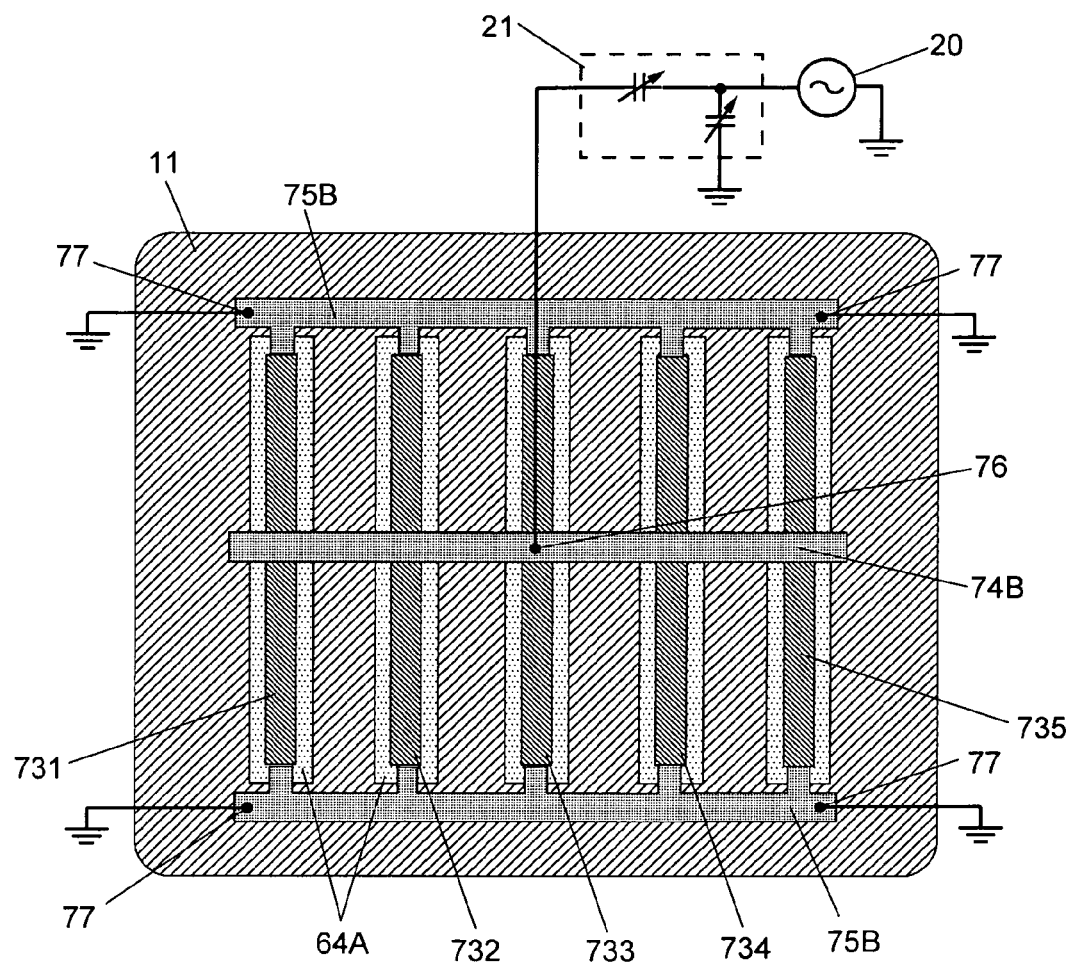
FIG. 17 is a schematic plan view of a radio-frequency antenna conductor and nearby components in the second modified example of the seventh embodiment.

As a second variation of the present embodiment, it is possible, as shown in FIG. 17, to provide a power-supply point 76 at the center of the power-supply bar 74B and a grounding point 77 at all the ends of the two grounding bars 77. This configuration also gives approximately the same impedance to all the radio-frequency antenna conductors and thereby produces almost the same radio-frequency current flowing through any of these antenna conductors.

Any of the previously described radio-frequency antenna structures can be provided at a plurality of positions at predetermined intervals, whereby a large-area plasma generation device or plasma processing device can be provided.

Eighth Embodiment

Figure 18:
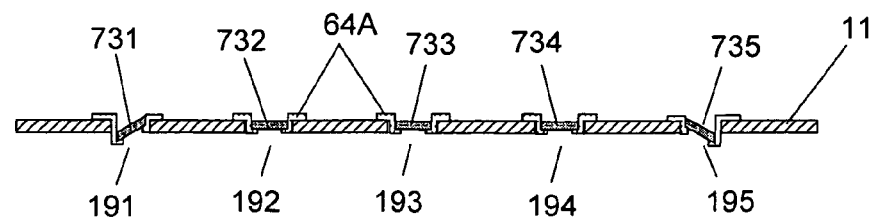
FIG. 18 is a schematic sectional view of the radio-frequency antenna conductor and nearby components in the eighth embodiment of the plasma generation device according to the present invention.

Regarding the configuration of the radio-frequency antenna and nearby components in a plasma generation device of the eighth embodiment, a schematic sectional view of the main components is shown in FIG. 18. As shown in FIG. 18, the device in the present embodiment has a radio-frequency antenna structure composed of three or more radio-frequency antenna conductors, in which at least the antenna conductors located at both extremities have their surfaces sloping upwards toward the inner antenna conductors. The inward-sloped surfaces of the antenna conductors located at both extremities compensates for a decrease in the electron density at both ends of the antenna structure, thus creating plasma having an approximately uniform density over the entire area.

In any of the foregoing embodiments, a radio-frequency power supply of 13.56 MHz was used. However, the frequency is not limited to this value. For example, the frequency may be as high as 500 MHz. Frequencies lower than 13.56 MHz are also applicable. However, to generate plasma with uniform density, it is preferable that the vacuum wavelength corresponding to the frequency of the radio-frequency power is equal to or greater than eight times the length of the rectangular radio-frequency antenna conductor.

Figure 19:
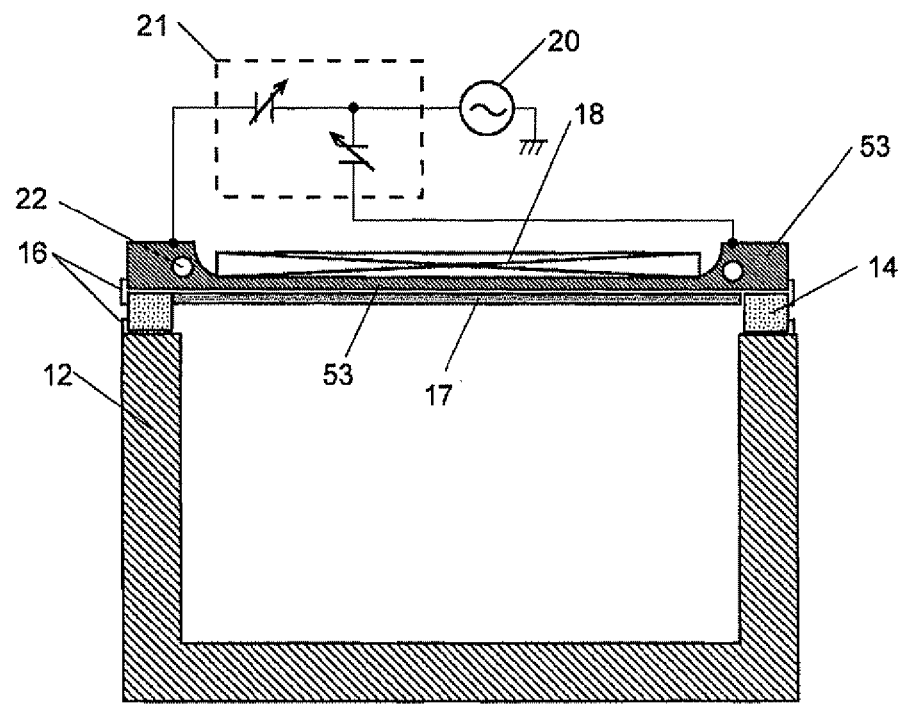
FIG. 19 is a schematic vertical sectional view showing an example of the present invention in which the entire top plate is formed by a radio-frequency antenna conductor.
Figure 20:
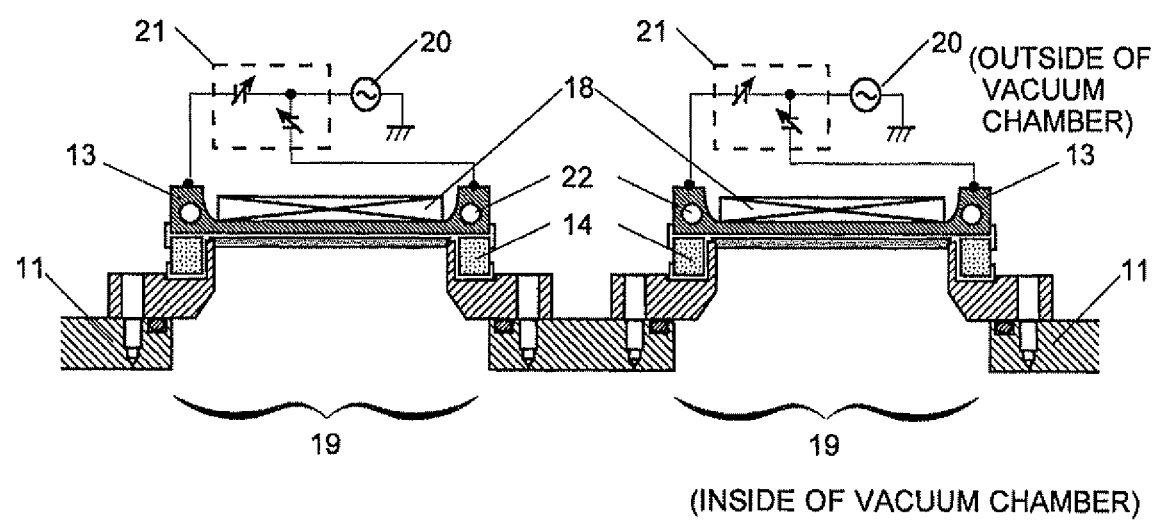
FIG. 20 is a schematic vertical sectional view showing an example of the present invention in which a plurality of radio-frequency antenna conductors are provided.

In the previous embodiments, the opening or openings were provided in a portion of the upper surface (top plate) of the vacuum container. Alternatively, as shown in FIG. 19, it is possible to use the entire top plate as the radio frequency antenna conductor 53. It is also possible to provide any of the previously described types of radio-frequency antenna conductors in the side wall of the vacuum container. In the case of using a plurality of radio-frequency antenna conductors, one set of the radio-frequency power and the matching box may be connected to each radio-frequency antenna conductor (FIG. 20). A radio-frequency antenna conductor having a non-rectangular shape may also be used.

EXPLANATION OF NUMERALS

11 . . . Vacuum Container
12 . . . Flange
13, 33, 43, 53, 63, 731, 732, 733, 734, 735 . . . Radio-Frequency Antenna Conductor 14, 44, 64, 64A ... Insulating Frame
15 ... First Vacuum Seal
16 ... Second Vacuum Seal
17, 47, 67 ... Dielectric Shield Plate
18 ... Magnetic Field Generator
19, 191, 192, 193, 194, 195, 49 ... Opening
20 ... Radio-Frequency Power Source
21 ... Matching Box
22 ... Cooling Water Channel
23 ... Hollow Portion
24 ... Gas Pipe
25 ... Exhaust Port
29 ... Substrate Stage
30 ... Projection
40 ... Langmuir Probe
61 ... Concavo-Convex Portion
61A ... Honeycomb Pattern
62 ... Copper Foil
65 ... Vacuum Seal
74, 74A, 74B ... Power-Supply Bar
75, 75A, 75B ... Grounding Bar
76 ... Power-Supply Point
77 ... Grounding Point
80 ... Mode-Changing Switch

The invention claimed is:

1. A plasma generation device, comprising:
   a) a vacuum container;
   b) an opening formed in a wall of the vacuum container; and
   c) a plate-shaped conductor being an inductive coupling radio-frequency antenna attached to the container so as to hermetically cover the opening.

2. The plasma generation device according to claim 1, wherein the aforementioned wall is made of a conducting material, and an insulator is provided between the radio-frequency antenna conductor and the wall.

3. The plasma generation device according to claim 1, wherein a flange for attaching the radio-frequency antenna conductor is provided at the opening.

4. The plasma generation device according to claim 1, further comprising a structure in which a plurality of openings are provided and each of a plurality of radio frequency antenna conductors is attached to each opening.

5. The plasma generation device according to claim 1, wherein the radio-frequency antenna conductor is rectangular, and one end in a longitudinal direction of the radio-frequency antenna conductor is connected to a radio-frequency power source via a matching box while the other end is connected to ground.

6. The plasma generation device according to claim 1, wherein a radio-frequency power source is connected to a center of the radio-frequency antenna conductor, and both ends in a longitudinal direction of the conductor are connected to ground.

7. The plasma generation device according to claim 5, further comprising a structure in which a plurality of openings are provided and each of a plurality of radio-frequency antenna conductors is attached to each opening; the radio-frequency antenna conductors are arranged parallel to each other at predetermined intervals; and a longitudinal end of each of the radio-frequency antenna conductors is electrically connected to a power-supply bar and the other longitudinal end of each of the radio-frequency antenna conductors is electrically connected to a grounding bar so that they are power-supplied and grounded and a same radio-frequency current flows through each of the radio-frequency antenna conductors.

8. The plasma generation device according to claim 7, wherein the radio-frequency power source is connected to one end of the power-supply bar, and the grounding bar that opposes the power-supply bar across the radio-frequency antenna conductors is connected to ground at an end near the radio-frequency antenna conductor that is farthest from the radio-frequency antenna conductor near a point where the radio-frequency power source is connected.

9. The plasma generation device according to claim 7, wherein a center of the power-supply bar is electrically connected to the radio-frequency power source, and both ends of the ground bar is connected to ground.

10. The plasma generation device according to claim 6, further comprising a structure in which a plurality of openings are provided and each of a plurality of radio-frequency antenna conductors is attached to each opening; the radio-frequency antenna conductors are arranged parallel to each other at predetermined intervals; a center of each of the radio-frequency antenna conductors is electrically connected to a power-supply bar and both longitudinal ends of each of the radio-frequency antenna conductors are electrically connected to a first grounding bar and a second grounding bar respectively so that they are power-supplied and grounded and a same radio-frequency current flows through each of the radio-frequency antenna conductors.

11. The plasma generation device according to claim 10, wherein one end of the power-supply bar is connected to the radio-frequency power source, and the first grounding bar and the second grounding bar are each connected to ground at an end near the radio-frequency antenna conductor that is farthest from the radio-frequency antenna conductor near a point where the radio-frequency power source is connected.

12. The plasma generation device according to claim 10, wherein a center of the power-supply bar is electrically connected to the radio-frequency power source, and both ends of the first grounding bar and the second grounding bar are respectively connected to ground.

13. The plasma generation device according to claim 7, wherein the number of radio-frequency antenna conductors is equal to or greater than three; and, at least two radio-frequency antenna conductors located at both ends of a parallel array of the radio-frequency antenna conductors have surfaces that are directed to the inside of the vacuum container and sloped toward the inner radio-frequency antenna conductors.

14. The plasma generation device according to claim 7, comprising a plurality of sets of the radio-frequency antenna conductors arranged parallel to each other.

15. The plasma generation device according to claim 14, further comprising an adjustment means for performing a power-amount control and matching regulation for the radio-frequency power source and the matching box connected to each of the aforementioned sets of the radio-frequency antenna conductors.

16. The plasma generation device according to claim 5, wherein a longitudinal length of the radio-frequency antenna is equal to or less than one eighth of a vacuum wavelength corresponding to a frequency of the radio-frequency power source.

17. The plasma generation device according to claim 1, further comprising a switching means for changing a mode of plasma between an inductively coupled plasma and a capacitively coupled plasma by switching the radio-frequency antenna between a grounded state and a non-grounded state.

18. The plasma generation device according to claim 1, further comprising a magnetic field generation means, provided outside the vacuum container, for generating, within the vacuum container, a magnetic line of force having a magnetic field component perpendicular to a plane of the radio-frequency antenna conductor.

19. The plasma generation device according to claim 18, wherein the magnetic field generation means is a permanent magnet.

20. The plasma generation device according to claim 18, wherein the magnetic field generation means is an electromagnet.

21. The plasma generation device according to claim 1, further comprising a shield plate provided so as to cover a surface of the radio-frequency antenna conductor inside the vacuum container.

22. The plasma generation device according to claim 21, wherein the shield plate is made of a material selected from oxides, nitrides, carbides and fluorides.

23. The plasma generation device according to claim 21, wherein the shield plate is made of a material selected from quartz, alumina, yttria and silicon carbide.

24. The plasma generation device according to claim 1, wherein a surface of the radio-frequency antenna conductor inside the vacuum container is covered with a dielectric coating.

25. The plasma generation device according to claim 24, wherein the dielectric coating is made of a material selected from oxides, nitrides, carbides and fluorides.

26. The plasma generation device according to claim 24, wherein the dielectric coating is made of a material selected from quartz, alumina, yttria and silicon carbide.

27. The plasma generation device according to claim 1, wherein an impedance of the radio-frequency antenna conductor on a surface inside the vacuum container is lower than an impedance thereof on a surface outside the vacuum container.

28. The plasma generation device according to claim 27, wherein the radio-frequency antenna conductor has a concavo-convex pattern formed on the surface thereof outside the vacuum container.

29. The plasma generation device according to claim 27, wherein the radio-frequency antenna conductor has a honeycomb pattern formed on the surface thereof outside the vacuum container.

30. The plasma generation device according to claim 27, wherein the surface of the radio-frequency antenna conductor inside the vacuum container is mirror finished.

31. The plasma generation device according to claim 27, wherein the radio-frequency antenna conductor includes a base body and a metallic member having a resistivity lower than that of the base body, and the low-resistivity metallic member is attached to a surface of the base body inside the vacuum container.

32. The plasma generation device according to claim 31, wherein the base body is made of a stainless steel.

33. The plasma generation device according to claim 31, wherein the base body is made of a ceramic.

34. The plasma generation device according to claim 33, wherein the ceramic is selected from oxides, nitrides, carbides and fluorides.

35. The plasma generation device according to claim 31, wherein the low-resistivity metallic member is made of a material selected from silver and copper.

36. The plasma generation device according to claim 31, further comprising a power-supply part, connected to the low-resistivity metallic member, for supplying electric power to the radio-frequency antenna conductor.

37. The plasma generation device according to claim 31, wherein a thickness of the low-resistivity metallic member is greater than a depth to which a skin effect can work on a radio-frequency current flowing in the low-resistivity metallic member.

38. The plasma generation device according to claim 1, wherein a surface of the radio-frequency antenna conductor inside the vacuum container is level with an inner wall surface of the vacuum container or projected from the inner wall surface into the inside of the vacuum container.

39. The plasma generation device according to claim 1, wherein the radio-frequency antenna conductor is fitted, via an insulator, in the opening formed in the wall of the vacuum container.

40. A plasma processing device, comprising the plasma generation device according to claim 1.

41. The plasma generation device according to claim 10, wherein: the number of radio-frequency antenna conductors is equal to or greater than three; and, at least two radio-frequency antenna conductors located at both ends of a parallel array of the radio-frequency antenna conductors have surfaces that are directed to the inside of the vacuum container and sloped toward the inner radio-frequency antenna conductors.

42. The plasma generation device according to claim 10, comprising a plurality of sets of the radio-frequency antenna conductors arranged parallel to each other.

43. The plasma generation device according to claim 42, further comprising an adjustment means for performing a power-amount control and matching regulation for the radio-frequency power source and a matching box connected to each of the aforementioned sets of the radio-frequency antenna conductors.

44. The plasma generation device according to claim 6, wherein a longitudinal length of the radio-frequency antenna conductor is equal to or less than one eighth of a vacuum wavelength corresponding to a frequency of the radio-frequency power source.

45. The plasma generating device according to claim 1, wherein one end of the radio-frequency antenna conductor is connected to a radio-frequency power source and an other end of the radio-frequency antenna conductor is directly connected to ground.

* * * * *